United States Patent
Morishita et al.

[11] Patent Number: 5,414,516
[45] Date of Patent: May 9, 1995

[54] POSITION MEASURING APPARATUS

[75] Inventors: Akihiko Morishita, Kawasaki; Osami Eda, Kamakura, both of Japan

[73] Assignee: Nikon Corporation, Tokyo, Japan

[21] Appl. No.: 249,269

[22] Filed: May 25, 1994

[30] Foreign Application Priority Data

Jun. 1, 1993 [JP] Japan .................................. 5-154321

[51] Int. Cl.⁶ .............................................. G01D 5/245
[52] U.S. Cl. ................................. 356/374; 250/231.16
[58] Field of Search .................... 356/374; 250/231.16, 250/237 G; 33/702, 707

[56] References Cited

U.S. PATENT DOCUMENTS

| | | | |
|---|---|---|---|
| 4,650,332 | 3/1987 | Muraoka et al. | 356/374 |
| 5,347,355 | 9/1994 | Eguchi | 250/231.16 |

FOREIGN PATENT DOCUMENTS

| | | |
|---|---|---|
| 56-96213 | 8/1981 | Japan . |
| 4-19485 | 3/1992 | Japan . |

OTHER PUBLICATIONS

Saishin Sokuryoukiki Binran ("Latest Surveying Instrument Handbook") Japan Surveying Instrument Manufacturers Association, Jun. 30, 1990, pp. 72-73.

*Primary Examiner*—Richard A. Rosenberger
*Attorney, Agent, or Firm*—Shapiro and Shapiro

[57] ABSTRACT

A position measuring apparatus for obtaining position information by processing a first and second sinusoidal signals with the phase difference of 90° obtained by a detecting device in accordance with change of a position, comprises an adding and subtracting device for generating a third sinusoidal signal by subtracting the second sinusoidal signal from the first sinusoidal signal and a fourth sinusoidal signal by adding the first and second sinusoidal signals, a maximum and minimum measuring device for measuring respective maximum and minimum values of the first to fourth sinusoidal signals, a processing device for calculating amplitudes and offsets of the respective first and second sinusoidal signals based on the maximum and minimum values of the first and second sinusoidal signals measured by the maximum and minimum measuring device, obtaining fifth and sixth sunusoidal signals by standardizing the first and second sinusoidal signals based on the obtained amplitudes and offsets, forming a seventh sinusoidal signal by subtracting the sixth sinusoidal signal from the fifth sinusoidal signal and an eighth sinusoidal signal by adding the fifth and sixth sinusoidal signals, correcting the ratio of the seventh sinusoidal signal to the eighth sinusoidal signal based on the ratio between respective amplitudes of the seventh and eighth sinusoidal signals obtained by the use of the maximum and minimum values of the third and fourth sinusoidal signals measured by the maximum and minimum measuring device, and obtaining the position information from the corrected value.

19 Claims, 6 Drawing Sheets

POSITION MEASURING APPARATUS

BACKGROUND OF THE INVENTION

1. Field of the Invention

The present invention relates to a position measuring apparatus for obtaining position information by processing two sinusoidal signals with the phase difference of 90° obtained by a detecting device in accordance with the change of a position and further to an encoder by the use of the position measuring apparatus and a surveying apparatus by the use of the encoder.

2. Related Background Art

Figure 1:
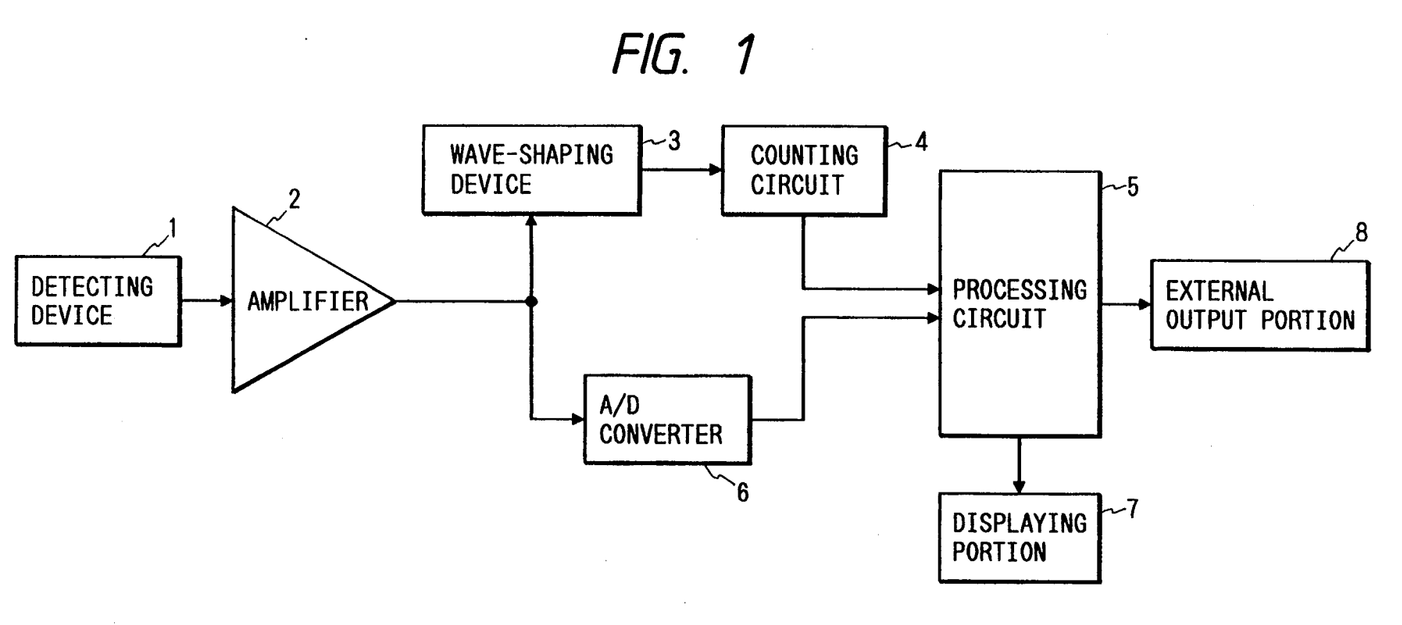
FIG. 1 is a block diagram showing an example of a conventional position measuring apparatus.

A conventional position measuring apparatus is shown in FIG. 1. Two sinusoidal signals having the phase difference of 90° are output from a detecting device 1. The sinusoidal signals are then amplified by an amplifier 2 and converted by a wave-shaping device 3 into rectangular signals which are supplied to a counting circuit 4. The counting circuit 4 counts the number of rectangular signals to obtain rough position information and supplies it to a processing circuit 5. On the other hand, the two sinusoidal signals with the phase difference of 90° amplified by the amplifier 2 are sent to an A/D converter 6 to be digitized and thereafter supplied to the processing circuit 5. The processing circuit 5 inputs the digitized two sinusoidal signals with the phase difference of 90° in a $\tan^{-1}$ table stored in a ROM to obtain minute displacement. Further, the processing circuit 5 obtains position information by adding this minute displacement and the above rough position information. Then, the position information is displayed on a displaying portion 7 as well as output to an external output portion 8. The detailed description of the conventional position measuring apparatus in FIG. 1 is disclosed in Japanese Patent Laid-Open Application No. 56-96213.

However, in the above-mentioned conventional position measuring apparatus, there is a problem that the accuracy of measurement is deteriorated by the fluctuation of accuracy of input sinusoidal signals.

If first and second sinusoidal signals A and B with the phase difference of 90° obtained from the detecting device 1 have respective amplitudes a and b and the phase error is $\alpha$, both the signals A and B are expressed as:

$$A = a \times \cos\theta + C1, \quad (1)$$

$$B = b \times \sin(\theta + \alpha) + C2 \quad (2)$$

However, when in order to obtain the position represented by the angle $\theta$, the first and second sinusoidal signals A and B are input to the A/D converter 6 and the angle $\theta$ is converted into the position by means of the $\tan^{-1}$ table, a position. error is produced owing to the difference between the amplitudes a, b, the phase difference $\alpha$ and the difference between the offsets C1, C2. If a, b, $\alpha$, C1 and C2 were constant, the processing and conversion could be performed by handling these as correction constants. But not so, this operation is impossible.

SUMMARY OF THE INVENTION

It is an object of the present invention to provide a position measuring apparatus capable of measuring a position with high accuracy without being affected by the accuracy of two sinusoidal signals output from a detecting device.

A position measuring apparatus of the present invention is for obtaining position information by processing first and second sinusoidal signals with the phase difference of 90° obtained by a detecting device in accordance with the change of a position, and provided with adding and subtracting means (e.g., an adding-subtracting circuit 25 in FIG. 3) for generating a third sinusoidal signal by subtracting the second sinusoidal signal from the first sinusoidal signal and a fourth sinusoidal signal by adding the first and second sinusoidal signals, maximum and minimum measuring means (e.g., a maximum and minimum measuring circuit 26 in FIG. 3) for measuring respective maximum and minimum values of the first to fourth sinusoidal signals and processing means (e.g., a processing circuit 27) for calculating amplitudes and offsets of the respective first and second sinusoidal signals based on the maximum and minimum values of the first and second sinusoidal signals measured by the maximum and minimum measuring means, obtaining fifth and sixth sinusoidal signals by standardizing the first and second sinusoidal signals based on the obtained amplitudes and offsets, forming a seventh sinusoidal signal by subtracting the sixth sinusoidal signal from the fifth sinusoidal signal and an eighth sinusoidal signal by adding the fifth and sixth sinusoidal signals, correcting the ratio of the seventh sinusoidal signal to the eighth sinusoidal signal based on the ratio between the respective amplitudes of the seventh and eighth sinusoidal signals obtained by the use of the maximum and minimum values of the third and fourth sinusoidal signals measured by the maximum and minimum measuring means, and obtaining the position information from the corrected value.

In the position measuring apparatus of the present invention, the first and second sinusoidal signals having the phase difference of 90° are obtained by the detecting device in accordance with the change of a position. Then, the third sinusoidal signal is generated by subtracting the second sinusoidal signal from the first sinusoidal signal and the fourth sinusoidal signal is generated by adding the first and second sinusoidal signals. Next, the respective maximum and minimum values of the first to fourth sinusoidal signals are measured. Based on the measured maximum and minimum values of the first and second sinusoidal signals, the respective amplitudes and offsets of the first and second sinusoidal signals are calculated. Then, the fifth and sixth sinusoidal signals are generated by standardizing the first and second sinusoidal signals based on the calculated amplitudes and offsets. Further, the seventh sinusoidal signal is formed by subtracting the sixth sinusoidal signal from the fifth sinusoidal signal and the eighth sinusoidal signal is formed by adding the fifth and sixth sinusoidal signals. Then, the ratio between the seventh and eighth sinusoidal signals is corrected based on the ratio between the amplitudes of the seventh and eighth sinusoidal signals obtained by the use of the maximum and minimum values of the third and fourth sinusoidal signals. Finally, position information is obtained from the corrected value. Therefore, there is no phase error between the seventh and eighth sinusoidal signals. Also, although the phase error between the first and second sinusoidal signals, i.e., the phase error between the fifth and sixth sinusoidal signals is absorbed in the amplitudes of the seventh and eighth sinusoidal signals, the ratio between the seventh and eighth sinusoidal signals are corrected based on the ratio between the amplitudes of the seventh and eighth sinusoidal signals. As a result, the position can be measured with high accuracy without being affected by the accuracy of the first and second sinusoidal signals output from the detecting device.

DESCRIPTION OF THE PREFERRED EMBODIMENTS

Figure 2:
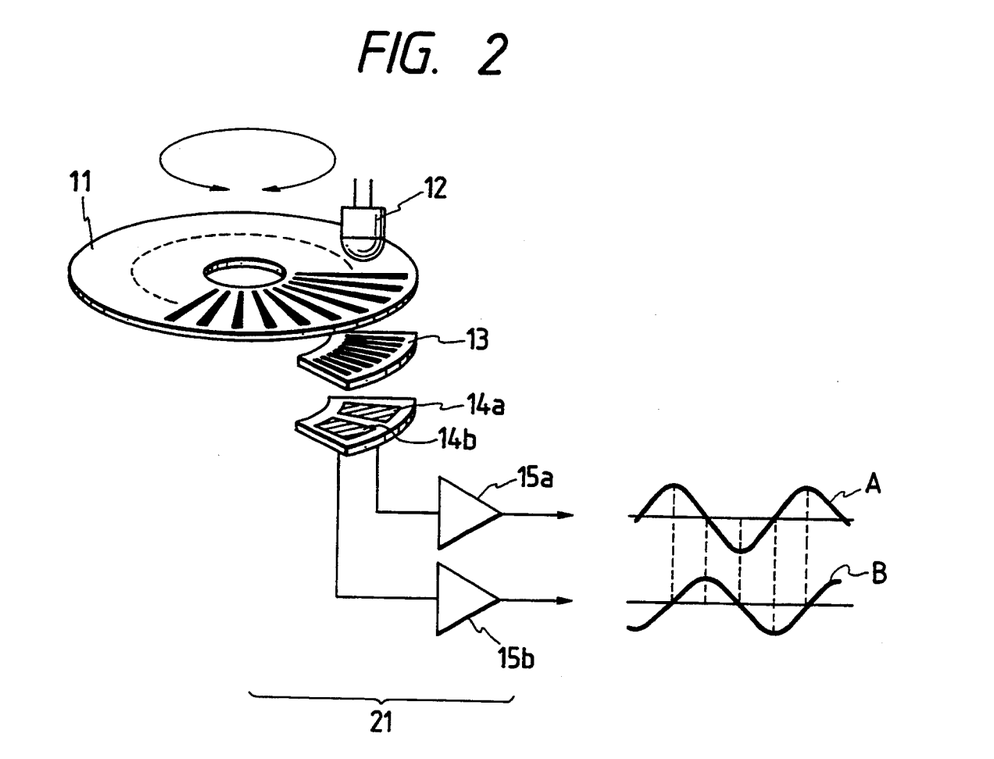
FIG. 2 is a diagram showing a detecting device, i.e., an encoder.

FIG. 2 shows the structure of a detecting device 21, i.e., an encoder. The detecting device 21 has a main scale 11, a light source 12, an index scale 13, detecting elements 14a and 14b, amplifiers 15a and 15b. The main scale 11 is constituted of a disk having an incremental pattern evaporated thereon. Light from the light source 12 is detected by the detecting elements 14a and 14b via the main scale 11 and the index scale 13. The detecting elements 14a and 14b are connected to the amplifiers 15a and 15b. The index scale 13 is formed with two types of patterns for an A-phase and a B-phase which have approximately the same pitches as the incremental pattern of the main scale 11. When the main scale 11 is rotated, the light from the light source 12 illuminating the detecting elements 14a and 14b is changed thereby to cause signals from the detecting elements 14a and 14b to be changed. The index scale 13 is disposed such that the phase difference between signals output from the respective detecting elements 14a and 14b becomes 90°. One signal output from the detecting element 14a or 14b is a sinusoidal signal of the A-phase while the other is a sinusoidal signal of the B-phase.

Figure 3:
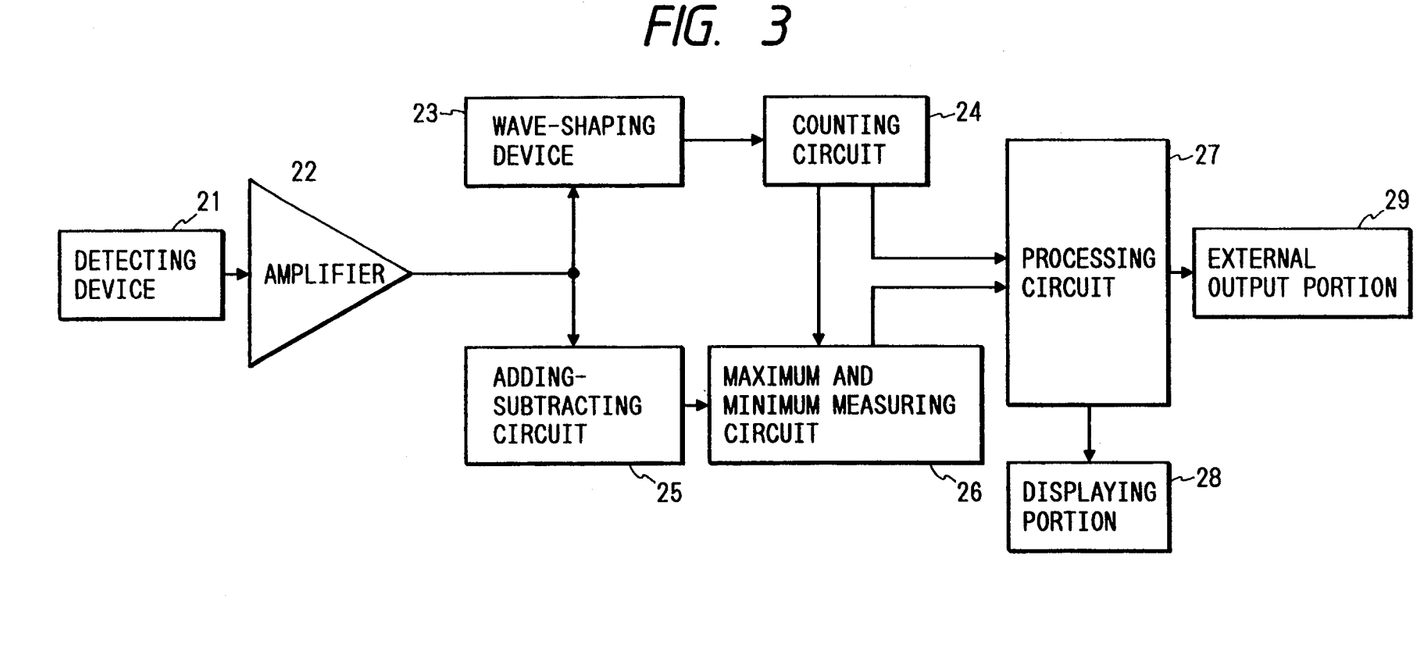
FIG. 3 is a block diagram showing a position measuring apparatus of an embodiment of the present invention.

FIG. 3 shows the structure of a position measuring apparatus of an embodiment of the present invention. In FIG. 3, the detecting device 21, an amplifier 22, a wave-shaping device 23 and a counting circuit 24 are the same as the conventional ones in FIG. 1. An adding-subtracting circuit 25 adds first and second sinusoidal signals with the phase difference of 90° obtained by the detecting device 21 in accordance with the change of the position and amplified by the amplifier 22 to generate a fourth sinusoidal signal and subtracts the second sinusoidal signal from the first sinusoidal signal to generate a third sinusoidal signal.

A maximum and minimum measuring circuit 26 measures maximum values and minimum values of the respective first, second, third and fourth sinusoidal signals. A processing circuit 27 calculates the amplitudes and the offsets of the first and second sinusoidal signals based on the maximum and minimum values of the first and second sinusoidal signals measured by the maximum and minimum measuring circuit 26, obtains fifth and sixth sinusoidal signals by standardizing the first and second sinusoidal signals based on the calculated amplitudes and offsets, forms a seventh sinusoidal signal by subtracting the sixth sinusoidal signal from the fifth sinusoidal signal, and an eighth sinusoidal signal by adding the fifth and sixth sinusoidal signals, corrects the ratio between the seventh and eighth sinusoidal signals based on the ratio between the amplitudes of the seventh and eighth sinusoidal signals calculated by the use of the maximum and minimum values of the third and fourth sinusoidal signals obtained by the maximum and minimum measuring circuit 26, obtains minute displacement from the obtained corrected value, attains position information by adding the minute displacement and rough position information from the counting circuit 24 and displays it on a displaying portion 28 as well as outputs it to an external output portion 29.

Next, the operation of the embodiment in FIG. 3 will be described more concretely. When the first sinusoidal signal A and the second sinusoidal signal B obtained from the detecting device 21 are $A = a \times \cos\theta + C1$ and $B = b \times \sin(\theta + \alpha) + C2$ as mentioned above, the adding-subtracting circuit 25 forms the third sinusoidal signal HA ($= A - B$) by subtracting the second sinusoidal signal B from the first sinusoidal signal A and the fourth sinusoidal signal HB ($= A + B$) by adding the first and second sinusoidal signals A and B. The third and fourth sinusoidal signals HA and HB can be expressed by the following equations (3) and (4):

$$HA = a \times \cos\theta - b \times \sin(\theta + \alpha) + C1 - C2 \quad (3)$$
$$= La \times \sin(\theta - \psi A) + \Delta C1,$$

$$HB = a \times \cos\theta + b \times \sin(\theta + \alpha) + C1 + C2 \quad (4)$$
$$= Lb \times \sin(\theta - \psi B) + \Delta C2.$$

Here, the amplitude terms La, Lb and the phase terms $\psi A$, $\psi B$ of the third and fourth sinusoidal signals HA and HB are functions of the amplitudes, a, b and the phase difference $\alpha$ of the first and second sinusoidal signals A and B as the following equations (5) to (8):

$$La = F1 (a, b, \alpha), \quad (5)$$

$$Lb = F2 (a, b, \alpha), \quad (6)$$

$$\psi A = F3 (a, b, \alpha), \quad (7)$$

$$\psi B = F4 (a, b, \alpha). \quad (8)$$

Figure 4:
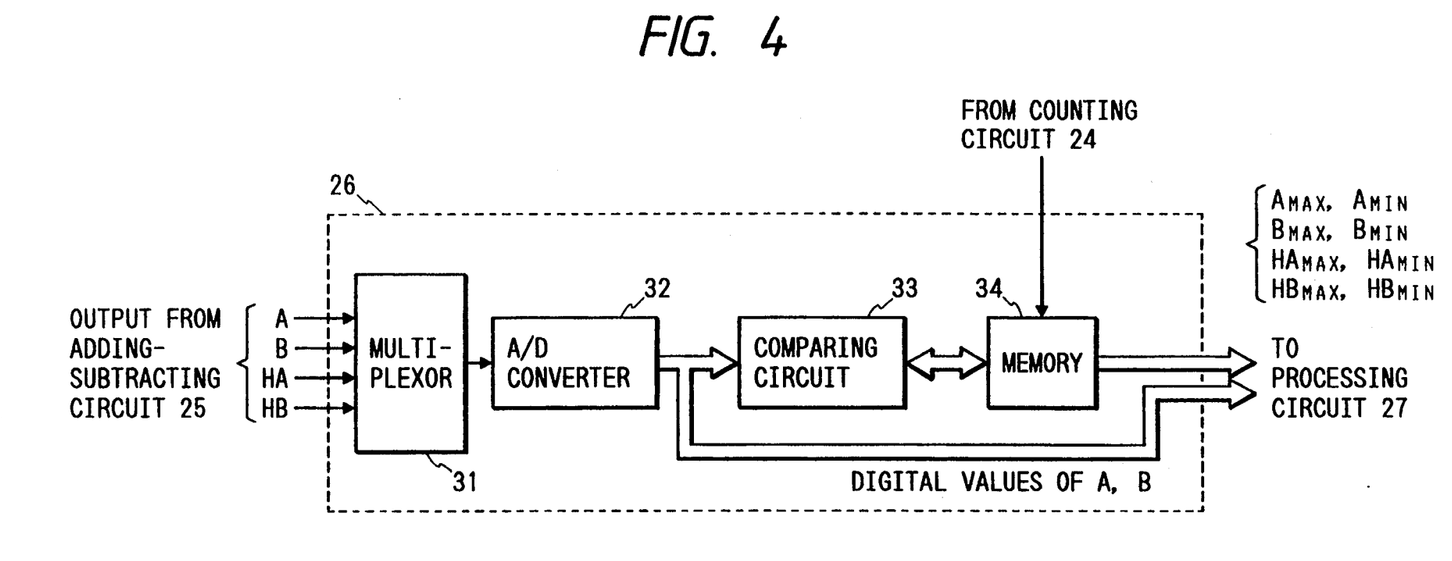
FIG. 4 is a block diagram showing the structure of the maximum and minimum measuring circuit in FIG. 3.

Next, the first, second, third and fourth sinusoidal signals A, B, HA and HB are supplied to the maximum and minimum measuring circuit 26. As shown in FIG. 4, the maximum and minimum measuring circuit 26 is constituted of a multiplexor 31, an A/D converter 32, a comparing circuit 33 and a memory 34.

In FIG. 4, the multiplexor 31 inputs the first to fourth sinusoidal signals A, B, HA and HB successively. The A/D converter 32 digitizes the first to fourth sinusoidal signals A, B, HA and HB supplied from the multiplexor 31. The comparing circuit 33 compares the maximum and minimum values stored in the memory 34 and the digitized signal values of the first to fourth sinusoidal signals one by one. When the signal values are larger than the maximum values, they are stored in the memory 34 as new maximum values while when the signal values are smaller than the minimum values, they are stored in the memory 34 as new minimum values.

The operation of obtaining the respective maximum and minimum values of the first to fourth sinusoidal signals A, B, HA and HB is continued until the first and second sinusoidal signals A and B are each input for a period or more. The change of periods of the first and second sinusoidal signals A and B can be obtained by the counting circuit 24. The memory 34 changes the areas for storing the above obtained maximum and minimum values in accordance with information from the counting circuit 24 and stores a plurality of maximum and minimum values.

Figure 5:
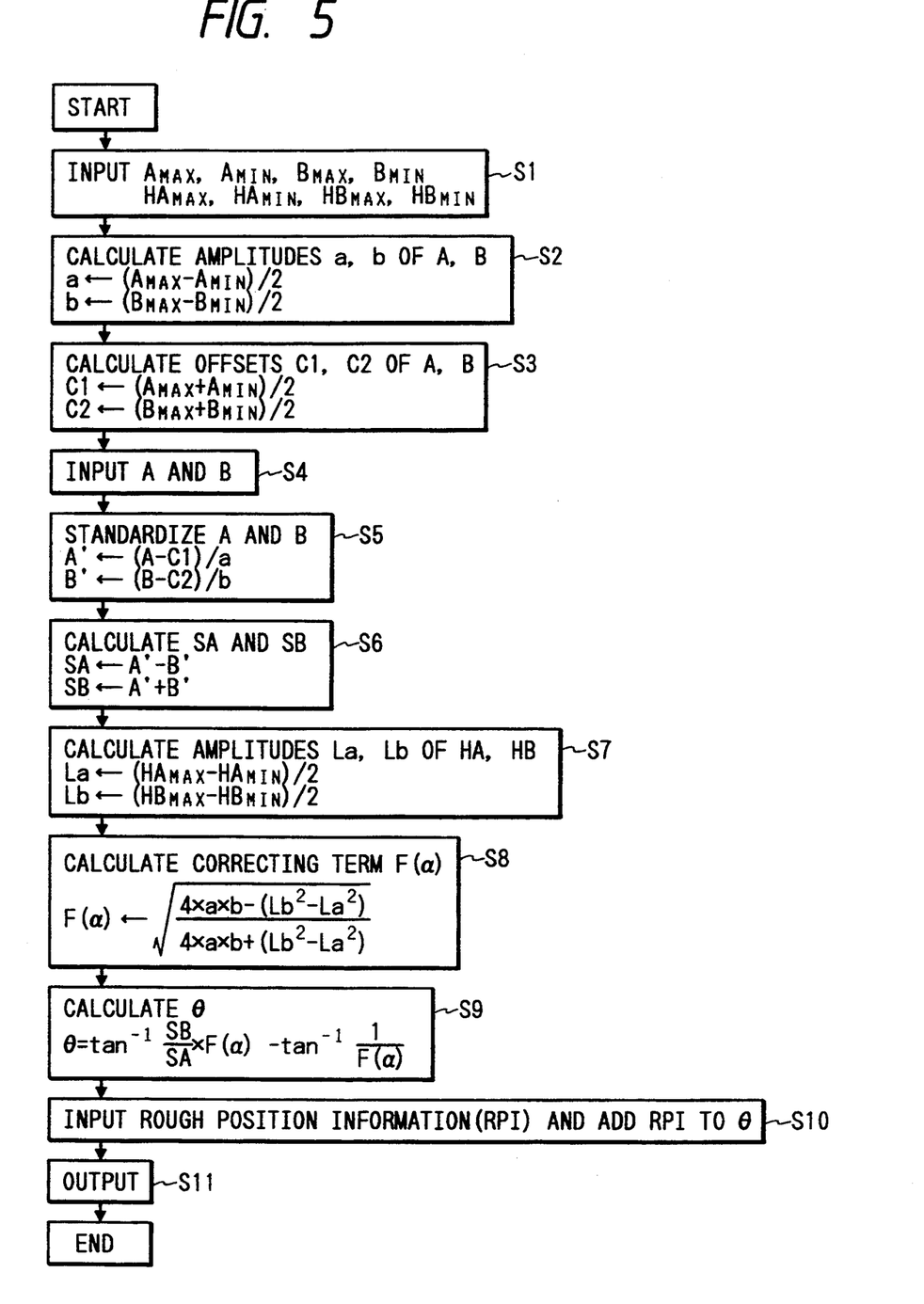
FIG. 5 is a flowchart showing the corrective calculation of the processing circuit.

Next, the processing circuit 27 calls the maximum and minimum values stored in the memory 34 as required and executes the following corrective calculations. FIG. 5 is a flowchart showing the corrective calculations of the processing circuit 27. If the maximum and minimum values of the respective first to fourth sinusoidal signals A, B, HA and HB are $A_{MAX}$, $A_{MIN}$, $B_{MAX}$, $B_{MIN}$, $HA_{MAX}$, $HA_{MIN}$, $HB_{MAX}$ and $HB_{MIN}$ (step S1), the amplitudes a and b of the respective first and second sinusoidal signals A and B are expressed as (step S2):

$$a = (A_{MAX} - A_{MIN})/2, \quad (9)$$

$$b = (B_{MAX} - B_{MIN})/2. \quad (10)$$

Similarly, the offsets C1 and C2 of the first and second sinusoidal signals A and B are expressed as (step S3):

$$C1 = (A_{MAX} + A_{MIN})/2, \quad (11)$$

$$C2 = (B_{MAX} + B_{MIN})/2. \quad (12)$$

The first and second sinusoidal signals A and B input directly from the A/D converter 32 (step S4) are standardized by the use of a, b, C1 and C2 obtained by the equations (9) to (12) to obtain the following fifth and sixth sinusoidal signals A' and B' (step S5):

$$A' = \cos\theta, \quad (13)$$

$$B' = \sin(\theta + \alpha). \quad (14)$$

Next, by the use of the standardized sinusoidal signals, i.e., the fifth and sixth sinusoidal signals A' and B', a new imaginary seventh sinusoidal signal SA is formed by subtracting the sixth sinusoidal signal B' from the fifth sinusoidal signal A' and a new imaginary eighth sinusoidal signal SB is formed by adding the fifth and sixth sinusoidal signals A' and B' (step S6) as follows:

$$SA = A' - B' = \cos\theta - \sin(\theta + \alpha) \quad (15)$$
$$= \sqrt{2 \times (1 - \sin\alpha)} \times \sin(\theta + \phi A)$$

$$SB = A' + B' = \cos\theta + \sin(\theta + \alpha) \quad (16)$$
$$= \sqrt{2 \times (1 + \sin\alpha)} \times \sin(\theta + \phi B).$$

Here,
$$\tan(\phi A) = (\sin\alpha - 1)/\cos\alpha, \quad (17)$$
$$\tan(\phi B) = (\sin\alpha + 1)/\cos\alpha, \quad (18)$$
$$\phi A = \phi B + \pi/2. \quad (19)$$

Accordingly, the seventh and eighth sinusoidal signals SA and SB can be expressed as follows:

$$SA = Ka \times \cos\beta, \quad (20)$$

$$SB = Kb \times \sin\beta. \quad (21)$$

Here, $$Ka = \sqrt{2 \times (1 - \sin\alpha)}, \quad (22)$$

$$Kb = \sqrt{2 \times (1 + \sin\alpha)}, \quad (23)$$

$$\beta = \theta + \phi B. \quad (24)$$

Therefore, in the imaginary seventh and eighth sinusoidal signals SA and SB formed in the processing circuit 27, the amplitude difference is left but the phase difference is canceled differently from the third and fourth sinusoidal signals HA and HB actually formed in the adding-subtracting circuit 25. Next, the amplitudes La and Lb of the respective third and fourth sinusoidal signals HA and HB are obtained from the maximum and minimum values of the third and fourth sinusoidal signals HA, HB as the following equations (25) and (26) (step S7). The amplitudes La and Lb may be obtained after inputting $HA_{MAX}$, $HA_{MIN}$, $HB_{MAX}$ and $HB_{MIN}$ in the step S1 and before the step S2. The order of the steps S2 and S3 may be reverse.

$$La = (HA_{MAX} - HA_{MIN})/2, \quad (25)$$

$$Lb = (HB_{MAX} - HB_{MIN})/2. \quad (26)$$

As known from the equations (5) and (6), La and Lb are the functions of the amplitudes a and b of the respective sinusoidal signals A and B and the phase difference α, so that α can be calculated reversely. As a result, it is possible to obtain the amplitudes Ka and Kb of the respective seventh and eighth sinusoidal signals SA and SB. Then, if signals wherein Ka and Kb of the respective equations (20) and (21) expressing the seventh and eighth sinusoidal signals SA and SB are canceled are SA' and SB', SA' and SB' become as follows and β can be obtained from the simple $\tan^{-1}$ table.

$$SA' = \cos\beta, \quad (27)$$

$$SB' = \sin\beta. \quad (28)$$

The maximum and minimum measuring circuit 26 sends the first and second sinusoidal signals among the first to fourth sinusoidal signals passed through the A/D converter 32 directly to the processing circuit 27. The processing circuit 27 forms the seventh and eighth sinusoidal signals SA and SB and obtains Ka and Kb (step S8). Finally, the processing circuit 27 executes the following calculation to calculate θ corresponding to a position (step S9).

$$\theta = \tan^{-1}(SB'/SA') - \phi B \quad (29)$$
$$= \tan^{-1}\{(SB/SA) \times F(\alpha)\} - \tan^{-1}\{1/F(\alpha)\}.$$

Here,
$$F(\alpha) = Ka/Kb. \quad (30)$$

F(α) is the function of Ka and Kb. Also, as α can be calculated by the use of the respective amplitudes, Ka and Kb are obtained by directly using the respective amplitudes.

The obtained position information, i.e., the minute displacement represents the position in a period of each of the first and second sinusoidal signals. The processing circuit 27 obtains final position information by adding the above minute displacement and the rough position information obtained by the counting circuit 24 (step S10). Thus, even though the original signals A and B have respectively the different amplitudes a and b and the different offsets C1 and C2, there is the phase difference α between the signals A and B and these amounts are fluctuated, the position can be calculated independently of these fluctuation amounts. The processing circuit 27 displays the calculated result on the displaying portion 28 and outputs values corresponding to the result to the external output portion 29 (step S11).

In this embodiment, it is possible to display not only the result of the final position conversion result but also the corrected values obtained by the above calculations, i.e., the signal information such as the amplitudes and offsets of the original signals A and B on the displaying portion 28. This information is utilized to check the condition of signals of the detecting device 21, whereby extreme deterioration and disorder of the condition thereof can be early discovered and recovered.

Also, the processing circuit 27 can be realized by the combination of a CPU and a ROM for defining the program for defining the operation of the CPU but can be realized by the hardwired logic too.

The above-described position measuring apparatus can measure a position with high accuracy, so is effective in a surveying instrument for measuring an angle with high accuracy by the use of, e.g., a rotary encoder. Of course, it is effective in various measuring apparatuses using linear encoders. The rotary encoder detects the angle while the linear encoder detects the distance (position).

Namely, the rotary encoder, as shown in FIG. 2, is formed of a rotatable disk provided along its circumference with an incremental pattern. This pattern divides an around, i.e., 360° thereby to detect the angle by the divided pitches.

On the other hand, the linear encoder is formed of a linear member provided with a linear incremental pattern. The distance is detected by the relative movement of the incremental pattern and a detecting block consisting of an index scale, a light source and a detecting device. More precisely, the distance from a starting point (the angle from a starting point in the case of the rotary encoder) is detected. Generally, the starting point is determined in advance by the initializing of the apparatus as the reference point.

Figure 6:
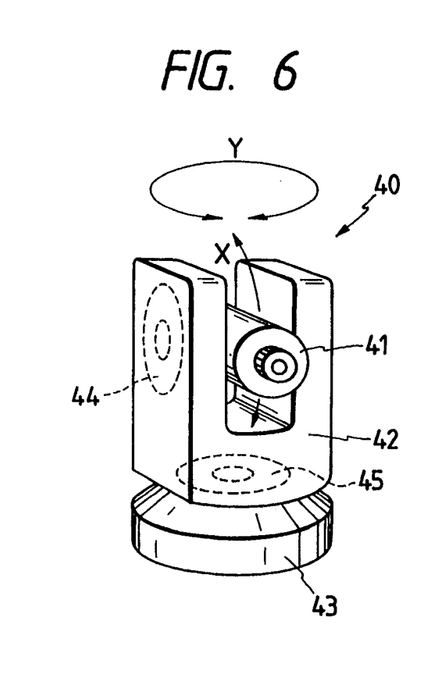
FIG. 6 is a perspective view showing a surveying apparatus provided with the position measuring apparatus of the present invention.

FIG. 6 is a perspective view of a surveying apparatus provided with a position measuring apparatus of the present invention. A surveying apparatus 40 has a telescope 41, a main body 42 for supporting the telescope 41 and a base 43 for supporting the main body 42. The telescope 41 is supported by the main body 42 so as to be rotatable in the vertical direction as indicated by an allow X. The main body 42 is supported by the base 43 so as to be rotatable in the horizontal direction as indicated by an allow Y. An encoder 44 of the present invention is mounted on the main body 42 so as to rotate together with the telescope 41 thereby to measure the rotation angle of the telescope 41 in the vertical direction X with high accuracy. Also, an encoder 45 of the present invention is mounted on the base 43 so as to rotate together with the main body 42 thereby to measure the rotation of the main body 42 in the horizontal direction Y, i.e., the angle of rotation of the telescope 41 in the horizontal direction with high accuracy. The encoder 45 may be secured to the base 43.

Figure 7:
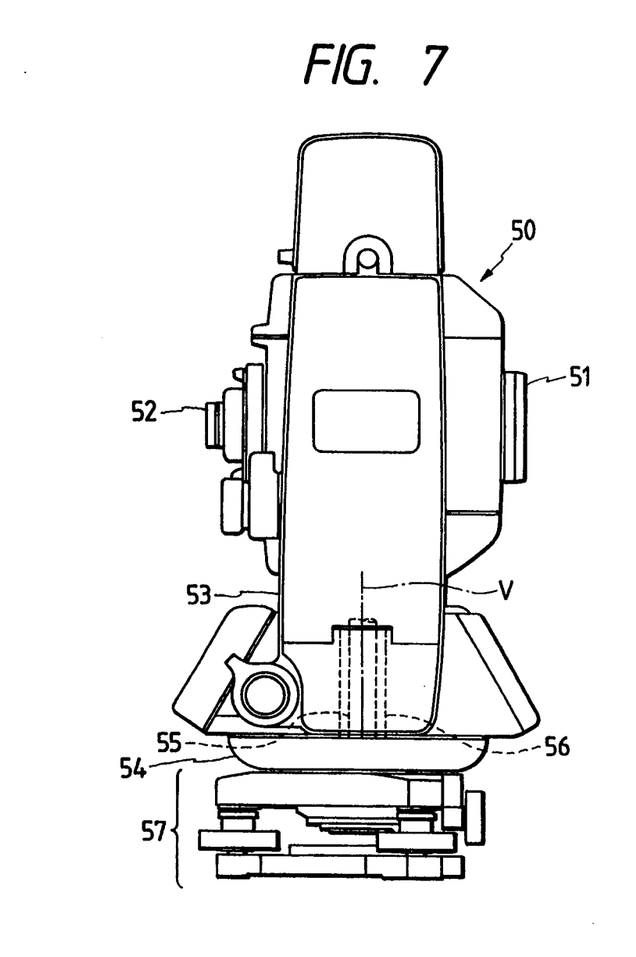
FIG. 7 is a diagram showing another example of a telescope.

FIG. 7 shows another example of a telescope. A telescope 50 has an objective lens 51 and an eye lens 52. This telescope 50 is provided therein with units for measuring the distance, so has a rectangular shape.

A main body 53 has a rotatable shaft 55 (indicated by a broken line) fixed to the lower portion thereof. Also, a bearing 56 is fixed to a lower section 54 of the main body 53. Accordingly, the main body 53 is rotatable along the vertical axis V. As the rotatable shaft 55 and the bearing 56 are provided in the vicinity of the center of the main body 53, they cannot be seen from outside. Then, two angle detecting units are provided respectively on a rotatable shaft of the telescope 50 and the rotatable shaft 55.

Although the angle detecting units have different structures, these structural difference is due to the types of rotatable shafts or the difference upon the design, so the detailed description is omitted. A reference numeral 57 represents a leveling device for leveling the main body 53 and the lower section 54.

An example of an encoder with a horizontal shaft is disclosed in Japanese Patent Publication No. 4-19485, wherein a rotatable shaft is fixed to a main body of a surveying apparatus, a bearing for receiving the rotatable shaft is formed in a lower section of the main body and a member 12 for rotating approximately integrally with the bearing is provided outside the bearing. A scale is secured to the member 12 and a detecting system 14 (20, 22, 24, 26, 28) is provided in the main body. The member 12 is usually secured to the bearing by a clamp 18 and is further secured integrally with the main body by a clamp 16 when a telescope is collimated with respect to a target. In addition, as the vertical shaft, there are a single spindle type, a double spindle type and an independent double spindle type disclosed in the page 73 of "Saishin Sokuryoukiki Binran" which means equally "Latest Surveying Instrument Handbook" edited by Japan Surveying Instrument manufactures Association and published on Jun. 30, 1990. The present invention is applicable to any of those. In the case of the single spindle, a scale and a detecting device are provided between A and B, while in the case of the double spindle, they are provided between A and C.

Although the surveying apparatus equipped only with the incremental encoders is described in this embodiment, encoders may be a combination of an incremental encoder and an absolute encoder.

As is apparent from the above description, according to the position measuring apparatus of the present invention, the first and second sinusoidal signals having the phase difference of 90° are obtained by the detecting device in accordance with the change of a position. Then, the third sinusoidal signal is generated by subtracting the second sinusoidal signal from the first sinusoidal signal and the fourth sinusoidal signal is generated by adding the first and second sinusoidal signals. Next, the respective maximum and minimum values of the first to fourth sinusoidal signals are measured. Based on the measured maximum and minimum values of the first and second sinusoidal signals, the respective amplitudes and offsets of the first and second sinusoidal signals are calculated. Then, the fifth and sixth sinusoidal signals are obtained by standardizing the first and second sinusoidal signals based on the calculated amplitudes and offsets. Further, the seventh sinusoidal signal is formed by subtracting the sixth sinusoidal signal from the fifth sinusoidal signal and the eighth sinusoidal signal is formed by adding the fifth and sixth sinusoidal signals. Then, the ratio between the seventh and eighth sinusoidal signals is corrected based on the ratio between the amplitudes of the seventh and eighth sinusoidal signals obtained by the use of the maximum and minimum values of the third and fourth sinusoidal signals. Finally, position information is obtained from the corrected value. Therefore, there is no phase error between the seventh and eighth sinusoidal signals. Also, although the phase error between the first and second sinusoidal signals, i.e., the phase error between the fifth and sixth sinusoidal signals is absorbed in the amplitudes of the seventh and eighth sinusoidal signals, the ratio between the seventh and eighth sinusoidal signals are corrected based on the ratio of between the amplitudes of the seventh and eighth sinusoidal signals. As a result, even though the condition of signals obtained from the detecting device is bad or signals are changed due to the change of the temperature, the position can be measured with high accuracy without being affected by the condition of the signals from the detecting device.

What is claimed is:

1. A position measuring apparatus for obtaining position information by processing a first and second sinusoidal signals with the phase difference of 90° obtained by a detecting device in accordance with change of a position, comprising:

adding and subtracting means for generating a third sinusoidal signal by subtracting said second sinusoidal signal from said first sinusoidal signal and a fourth sinusoidal signal by adding said first and second sinusoidal signals;

maximum and minimum measuring means for measuring respective maximum and minimum values of said first to fourth sinusoidal signals;

processing means for calculating amplitudes and offsets of said respective first and second sinusoidal signals based on said maximum and minimum values of said first and second sinusoidal signals measured by said maximum and minimum measuring means, obtaining fifth and sixth sinusoidal signals by standardizing said first and second sinusoidal signals based on said obtained amplitudes and offsets, forming a seventh sinusoidal signal by subtracting said sixth sinusoidal signal from said fifth sinusoidal signal and an eighth sinusoidal signal by adding said fifth and sixth sinusoidal signals, correcting the ratio of said seventh sinusoidal signal to said eighth sinusoidal signal based on the ratio between amplitudes of said respective seventh and eighth sinusoidal signals obtained by the use of said maximum and minimum values of said third and fourth sinusoidal signals measured by said maximum and minimum measuring means, and obtaining said position information from said corrected value.

2. A position measuring apparatus according to claim 1, further comprising:

a wave-shaping device for converting said first and second sinusoidal signals into rectangular signals; and a counting circuit for outputting rough position information by counting the number of said rectangular signals, said processing means obtaining said position information by adding said rough position information and minute displacement obtained from said corrected value.

3. An encoder comprising:

a main scale having an incremental pattern evaporated thereon;

an index scale formed with two patterns having the same pitches as said incremental pattern;

a light source emitting light to the main scale and said index scale;

two detecting elements for receiving the light from said light source passed through said main scale and said index scale and generating first and second sinusoidal signals;

said index scale being disposed such that the phase difference between said first and second sinusoidal signals becomes 90°;

adding and subtracting means for generating a third sinusoidal signal by subtracting said second sinusoidal signal from said first sinusoidal signal and a fourth sinusoidal signal by adding said first and second sinusoidal signals;

maximum and minimum measuring means for measuring respective maximum and minimum values of said first to fourth sinusoidal signals;

processing means for calculating amplitudes and offsets of said respective first and second sinusoidal signals based on said maximum and minimum values of said first and second sinusoidal signals measured by said maximum and minimum measuring means, obtaining fifth and sixth sinusoidal signals by standardizing said first and second sinusoidal signals based on said obtained amplitudes and offsets, forming a seventh sinusoidal signal by subtracting said sixth sinusoidal signal from said fifth sinusoidal signal and an eighth sinusoidal signal by adding said fifth and sixth sinusoidal signals, correcting the ratio of said seventh sinusoidal signal to said eighth sinusoidal signal based on the ratio of respective amplitudes of said seventh and eighth sinusoidal signals obtained by the use of said maximum and minimum values of said third and fourth sinusoidal signals measured by said maximum and minimum measuring means, and obtaining said position information from said corrected value.

4. An encoder according to claim 3, further comprising:

a wave-shaping device for converting said first and second sinusoidal signals into rectangular signals; and a counting circuit for outputting rough position information by counting the number of said rectangular signals, said processing means obtaining said position information by adding said rough position information and minute displacement obtained from said corrected value.

5. A surveying apparatus comprising:

a telescope;

a supporting member for supporting said telescope rotatably;

an encoder for measuring a relative rotation angle of said telescope with respect to said supporting member, said encoder having a circular main scale with an incremental pattern evaporated thereon and an index scale formed with two patterns having the same pitches as said incremental pattern;

a light source for emitting light to said main scale and said index scale;

two detecting elements for receiving the light from said light source passing said main scale and said index scale and generating first and second sinusoidal signals while said main scale is doing relative movement with respect to said index scale;

said index scale being disposed such that the phase difference of said first and second sinusoidal signals becomes 90°;

adding and subtracting means for generating a third sinusoidal signal by subtracting said second sinusoidal signal from said first sinusoidal signal and a fourth sinusoidal signal by adding said first and second sinusoidal signals;

maximum and minimum measuring means for measuring respective maximum and minimum values of said first to fourth sinusoidal signals;

processing means for calculating amplitudes and offsets of said respective first and second sinusoidal signals based on said maximum and minimum values of said first and second sinusoidal signals measured by said maximum and minimum measuring means, obtaining fifth and sixth sinusoidal signals by standardizing said first and second sinusoidal signals based on said obtained amplitudes and offsets, forming a seventh sinusoidal signal by subtracting said sixth sinusoidal signal from said fifth sinusoidal signal and an eighth sinusoidal signal by adding said fifth and sixth sinusoidal signals, correcting the ratio of said seventh sinusoidal signal to said eighth sinusoidal signal based on the ratio between amplitudes of said respective seventh and eighth sinusoidal signals obtained by the use of said maximum and minimum values of said third and fourth sinusoidal signals measured by said maximum and minimum measuring means, and obtaining said position information from said corrected value.

6. A surveying apparatus according to claim 5, wherein said main scale is fixed to said telescope to rotate together with said telescope and said index scale is fixed to said supporting member.

7. A surveying apparatus according to claim 6, wherein said supporting member supports said telescope such that said telescope is rotatable on a vertical plane.

8. A surveying apparatus according to claim 6, wherein said supporting member supports said telescope such that said telescope is rotatable on a horizontal plane.

9. A surveying apparatus according to claim 5, wherein said main scale is fixed to said supporting member and said index scale is fixed to said telescope to rotate together with said telescope.

10. A surveying apparatus according to claim 9, wherein said supporting member supports said telescope such that said telescope is rotatable on a vertical plane.

11. A surveying apparatus according to claim 9, wherein said supporting member supports said telescope such that said telescope is rotatable on a horizontal plane.

12. A surveying apparatus according to claim 5, further comprising:

a supporting base for supporting said supporting member rotatably;

a second encoder for measuring a relative rotation angle of said supporting member with respect to said supporting base, said second encoder having a circular second main scale with an incremental pattern evaporated thereon and a second index scale formed with two patterns having the same pitches as said incremental pattern;

a second light source for emitting light to said second main scale and said second index scale; and two second detecting elements for receiving the light from said second light source passing said second main scale and said second index scale and generating first and second sinusoidal signals while said second main scale is doing relative movement with respect to said second index scale, said second index scale being disposed such that the phase difference of said first and second sinusoidal signals becomes 90° and said processing means obtaining second position information by processing said first and second sinusoidal signals from said second detecting elements.

13. A surveying apparatus according to claim 12, wherein said second main scale is fixed to said supporting member so as to rotate together with said supporting member and said second index scale is fixed to said supporting base.

14. A surveying apparatus according to claim 13, wherein said supporting base supports said supporting member such that said supporting member is rotatable on a vertical plane.

15. A surveying apparatus according to claim 13, wherein said supporting base supports said supporting member such that said supporting member is rotatable on a horizontal plane.

16. A surveying apparatus according to claim 12, wherein said second main scale is fixed to said supporting base and said second index scale is fixed to said supporting member so as to rotate together with said supporting member.

17. A surveying apparatus according to claim 16, wherein said supporting base supports said supporting member such that said supporting member is rotatable on a vertical plane.

18. A surveying apparatus according to claim 16, wherein said supporting base supports said supporting member such that said supporting member is rotatable on a horizontal plane.

19. A surveying apparatus according to claim 5, further comprising:

a wave-shaping device for converting said first and second sinusoidal signals into rectangular signals; and a counting circuit for outputting rough position information by counting the number of said rectangular signals, said processing means obtaining said position information by adding said rough position information and minute displacement obtained from said corrected value.

* * * * *